United States Patent
Jagannathan et al.

(10) Patent No.: US 7,943,458 B2
(45) Date of Patent: May 17, 2011

(54) METHODS FOR OBTAINING GATE STACKS WITH TUNABLE THRESHOLD VOLTAGE AND SCALING

(75) Inventors: Hemanth Jagannathan, Albany, NY (US); Sivananda K. Kanakasabapathy, Albany, NY (US); Matthew W. Copel, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 32 days.

(21) Appl. No.: 12/574,318

(22) Filed: Oct. 6, 2009

(65) Prior Publication Data

US 2011/0081754 A1  Apr. 7, 2011

(51) Int. Cl.
  *H01L 21/336* (2006.01)
  *H01L 21/8234* (2006.01)
  *H01L 21/8238* (2006.01)

(52) U.S. Cl. ........ 438/199; 438/197; 438/202; 438/210; 438/216; 438/153; 257/E21.632; 257/E21.633; 257/E21.639

(58) Field of Classification Search ........... 257/E21.632, 257/E21.633, E21.639
See application file for complete search history.

(56) References Cited

U.S. PATENT DOCUMENTS

| | | | |
|---|---|---|---|
| 7,023,055 B2 | 4/2006 | Ieong et al. | |
| 7,329,923 B2 | 2/2008 | Doris et al. | |
| 7,749,832 B2 * | 7/2010 | Li | 438/199 |
| 2003/0180994 A1 * | 9/2003 | Polishchuk et al. | 438/199 |
| 2005/0116290 A1 | 6/2005 | de Souza et al. | |
| 2005/0280099 A1 * | 12/2005 | Park et al. | 257/374 |
| 2007/0138565 A1 * | 6/2007 | Datta et al. | 257/369 |
| 2008/0067606 A1 * | 3/2008 | Jung et al. | 257/369 |
| 2008/0096383 A1 * | 4/2008 | Tigelaar et al. | 438/652 |
| 2008/0233694 A1 * | 9/2008 | Li | 438/216 |
| 2009/0072312 A1 * | 3/2009 | Chang et al. | 257/351 |
| 2009/0140345 A1 * | 6/2009 | Zhu | 257/369 |
| 2010/0193875 A1 * | 8/2010 | Lee et al. | 257/369 |
| 2010/0258881 A1 * | 10/2010 | Chudzik et al. | 257/410 |
| 2010/0289088 A1 * | 11/2010 | Li et al. | 257/392 |

* cited by examiner

*Primary Examiner* — Charles D Garber
*Assistant Examiner* — Mohsen Ahmadi
(74) *Attorney, Agent, or Firm* — Scully, Scott, Murphy & Presser, P.C.; Louis J. Percello, Esq.

(57) ABSTRACT

Methods of forming complementary metal oxide semiconductor (CMOS) structures with tunable threshold voltages are provided. The methods disclose a technique of obtaining selective placement of threshold voltage adjusting materials on a semiconductor substrate by using a block mask prior to deposition of the threshold voltage adjusting materials. The block mask is subsequently removed to obtain a patterned threshold voltage adjusting material on the semiconductor substrate. The methods are material independent and can be used in sequence for both nFET threshold voltage adjusting materials and pFET threshold voltage adjusting materials.

17 Claims, 9 Drawing Sheets

METHODS FOR OBTAINING GATE STACKS WITH TUNABLE THRESHOLD VOLTAGE AND SCALING

BACKGROUND

The present invention relates to methods of fabricating semiconductor structures. More particularly, the present invention relates to methods of fabricating complementary metal oxide semiconductor (CMOS) structures including threshold voltage tuned and scaled gate stacks.

In semiconductor devices including field effect transistors (FETs), threshold voltage of the transistors has been controlled by doping an impurity into the channel region and by appropriately adjusting the dose amount. Threshold voltage control using only this technique, e.g., only through adjustment of the amount of channel impurity, however, raises nonconformities such that an increase in the dose of the impurity to be doped into the channel region may lower ON-state current due to scattering by the impurity, may increase the Gate-Induced Drain Leakage (GIDL) current, and may increase substrate current upon application of substrate voltage. For this reason, low-power-consumption devices having a large amount of impurity doped into the channel region have occasionally resulted in a decrease in the ON-state current, and an increase in the GIDL current.

Another prior art technique that has been used to control the threshold voltage of the FET device is to fabricate a device in which different conductivity type transistors, e.g., nFETs and pFETs, are formed on gate oxides that have a different thickness. That is, it is known to form a device in which the thickness of the gate oxide film of an nFET is different from that of a gate oxide film of a pFET.

In recent years, there has been another trend of using a high dielectric constant film, i.e., a high k dielectric, as the gate insulating film of FET devices. High k dielectrics are those dielectrics that have a dielectric constant that is greater than silicon oxide. Representative high k dielectrics that are useful as a gate insulating material include metal oxides such as, for example, zirconium oxide and hafnium oxide. The use of high k dielectrics as the gate insulating film of a metal oxide semiconductor field effect transistor (MOSFET) can successfully reduce the equivalent silicon oxide thickness in an electrical sense, even if the physical thickness thereof is increased relative to a silicon oxide dielectric film. Hence, high k dielectrics, when used as a gate insulating film, are stable both in a physical sense and in a structural sense. This makes it possible to increase the metal oxide semiconductor (MOS) capacitance for improved MOSFET characteristics, and to reduce gate leakage current as compared with conventional devices in which silicon oxide was used as the gate insulating film.

Although high k dielectrics provide improvements over conventionally used silicon oxide as the gate insulating film in a FET device, the use of the same is not without problems. For example, FET devices including high k gate dielectrics exhibit a non-ideal threshold voltage when the device is used.

In the prior art, various techniques including, for example, forming a threshold voltage adjusting layer interposed between the high k gate dielectric and the gate electrode have been proposed. In such threshold voltage adjusting techniques, the threshold voltage adjusting layers for nFET and pFETs are deposited as blanket layers and need to be patterned by etching for CMOS device fabrication. The acts of deposition and removal of the threshold voltage adjusting layers result in residual traces that impact the threshold voltage of the devices.

Also, in prior art techniques in which a threshold voltage adjusted gate stack is provided that includes a threshold voltage adjusting layer interposed between a high k gate dielectric and a gate electrode, wet etching is typically used in patterning the threshold voltage adjusted gate stacks. When wet etching is employed in patterning the threshold voltage adjusted gate stacks, an undercut of the threshold voltage adjusting layer beneath the gate electrode is observed. The undercutting of the threshold voltage adjusting layer is undesirable since the dimension of the final gate stack would deviate from required criteria. Moreover, the wet etching employed should be benign to the regions being protected, while being potent in the regions needed for removal.

SUMMARY OF INVENTION

Methods of forming complementary metal oxide semiconductor (CMOS) structures with tunable threshold voltages are provided. The methods disclosed in the instant application include a technique of obtaining selective placement of threshold voltage adjusting materials on a semiconductor substrate by using a block mask prior to deposition of the threshold voltage adjusting materials. The block mask is subsequently removed to obtain a patterned threshold voltage adjusting material on the semiconductor substrate. The methods are material independent and can be used in sequence for both nFET threshold voltage adjusting materials and pFET threshold voltage adjusting materials. In some embodiments, the methods allow for the use of a single conductive material, particularly a single metal, and a single high k gate dielectric (i.e., a dielectric having a dielectric constant that is greater than silicon oxide) to obtain band edge CMOS devices on the same semiconductor substrate.

In a first embodiment of the invention, a method of fabricating a complementary metal oxide semiconductor (CMOS) structure with tunable threshold voltage is disclosed in which threshold voltage adjusting materials are selectively formed above a high k gate dielectric. In the first embodiment, the method includes providing a structure including a high k gate dielectric located atop a semiconductor substrate, said semiconductor substrate including at least two device regions. A first block mask is formed on a surface of the high k gate dielectric in one of the device regions, while leaving the high k gate dielectric exposed in another device region. A first threshold voltage adjusting material is formed on the first block mask in the one device region and atop the exposed high k gate dielectric in the another device region. The first threshold voltage adjusting material and the first block mask are removed from the one device region, while maintaining the first threshold voltage adjusting material in the another device region. A second block mask is formed on the first threshold voltage adjusting material, while leaving the high k gate dielectric within the one device region exposed. A second threshold voltage adjusting material is formed on the second block mask in the another device region and atop the exposed high k gate dielectric in the one device region. The second threshold voltage adjusting material and the second block mask are removed from the another device region, while maintaining the second threshold voltage adjusting material in the one device region.

The method of the first embodiment can also include a step of forming a conductive material atop the first and second threshold voltage adjusting materials in both device regions. The method of the first embodiment can also include a patterning step in which the material stack in both device regions is patterned into a gate stack. In some cases of the first embodiment of the invention, the patterned gate stack in the one device region includes, from bottom to top, a patterned high k gate dielectric, a patterned second threshold voltage adjusting material and a patterned conductive material, while the patterned gate stack in the another device region includes, from bottom to top, a patterned high k gate dielectric, a patterned first threshold voltage adjusting material and a patterned conductive material. After forming the patterned gate stacks in the various device regions, further CMOS processing can be performed.

In a second embodiment of the invention, a method of fabricating a complementary metal oxide semiconductor (CMOS) structure with tunable threshold voltage is disclosed in which threshold voltage adjusting materials are selectively formed prior to the formation of the high k gate dielectric. In the second embodiment, the method includes providing a semiconductor substrate having at least two device regions. A first block mask is formed atop a surface of the semiconductor substrate in one of the device regions, while leaving a surface of the semiconductor substrate in another device region exposed in another device region. A first threshold voltage adjusting material is formed on the first block mask in the one device region and atop the exposed semiconductor material in the another device region. The first threshold voltage adjusting material and the first block mask are removed from the one device region, while maintaining the first threshold voltage adjusting material in the another device region. A second block mask is formed on the first threshold voltage adjusting material, while leaving the surface of the semiconductor substrate within the one device region exposed. A second threshold voltage adjusting material is formed on the second block mask in the another device region and atop the exposed surface of the semiconductor substrate in the one device region. The second threshold voltage adjusting material and the second block mask are removed from the another device region, while maintaining the second threshold voltage adjusting material in the one device region. A high k gate dielectric is formed atop the first threshold voltage adjusting material and atop the second threshold voltage adjusting material in the at least two device regions. A conductive material is formed atop the high k gate dielectric in the at least two device regions.

The method of the second embodiment can also include a patterning step in which the material stack in both device regions is patterned into a gate stack. In some cases of the second embodiment of the invention, the patterned gate stack in the one device region includes, from bottom to top, a patterned second threshold voltage adjusting material, a patterned high k gate dielectric, and a patterned conductive material, while the patterned gate stack in the another device region includes, from bottom to top, a patterned first threshold voltage adjusting material, a patterned high k gate dielectric, and a patterned conductive material. After forming the patterned gate stacks in the various device regions, further CMOS processing can be performed.

In a third embodiment of the present invention, a method of fabricating a complementary metal oxide semiconductor (CMOS) structure with tunable threshold voltage is disclosed in which some threshold voltage adjusting materials are selectively formed prior to the formation of a high k gate dielectric and other threshold voltage adjusting materials are selectively formed after formation of the high k gate dielectric such that some threshold voltage adjusting material are located beneath the high k gate dielectric and other threshold voltage adjusting materials are formed atop the high k gate dielectric. This embodiment of the present invention includes providing a semiconductor substrate having at least two device regions. A first block mask is formed within one of the device regions, while an upper surface of the substrate in another device region is exposed. A first threshold voltage adjusting material is formed on all exposed surfaces of the structure including the first block mask. The first threshold voltage adjusting material and the first block mask are removed from the one device region, while the first threshold voltage adjusting material remains in the another device region. A high k gate dielectric is formed on all exposed surfaces of the structure thus formed. A second block mask is formed atop the high k gate dielectric in the device region including the first threshold voltage adjusting material. A second threshold voltage adjusting material is formed on all exposed surfaces of the structure including the second block mask. The second threshold voltage adjusting material and the second block mask are selectively removed from the device region including the first threshold voltage adjusting material, while the second threshold voltage adjusting material is maintained atop the high k gate dielectric in the another device region. A conductive material can be formed atop the high k gate dielectric and the second threshold voltage adjusting material. A gate patterning step and further CMOS processing can be formed as described above in the first embodiment of the invention. In some cases of the third embodiment, a first patterned gate stack is provided that includes, from bottom to top, a patterned high k gate dielectric, a patterned second threshold voltage adjusting material, and a patterned conductive material, and a second patterned gate stack is provided that includes, from bottom to top, a patterned first threshold voltage adjusting material, a patterned high k gate dielectric and a patterned conductive material.

DETAILED DESCRIPTION

The present invention, which provides methods for fabricating gate stacks with tunable threshold voltage and scaling, will now be described in greater detail by referring to the following discussion and drawings that accompany the present application. It is observed that the drawings of the present application are provided for illustrative proposes and, as such, the drawings are not drawn to scale.

In the following description, numerous specific details are set forth, such as particular structures, components, materials, dimensions, processing steps and techniques, in order to provide an understanding of some aspects of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIGS. 1-9, there is shown a first embodiment of the present invention in which threshold voltage patterning is performed after formation of a high k gate dielectric on a surface of a semiconductor substrate.

Figure 1:
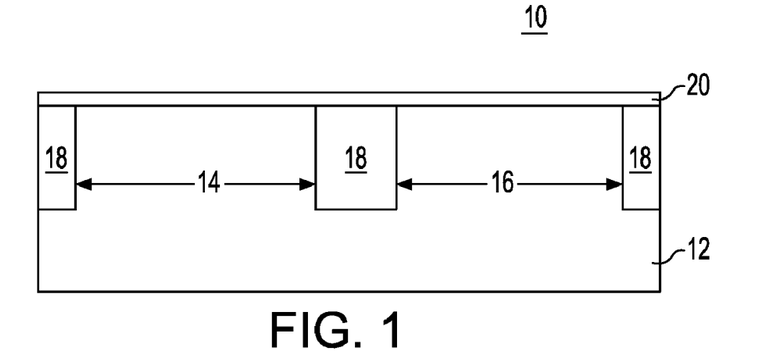
FIG. 1 is a pictorial representation (through a cross sectional view) depicting an initial structure including a high k gate dielectric located atop a semiconductor substrate that can be employed in a first embodiment of the invention.

Referring to FIG. 1, there is shown an initial structure 10 that can be employed in a first embodiment of the invention. Specifically, the initial structure 10 includes a semiconductor substrate 12 having a first device region 14 and a second device region 16. The initial structure 10 also includes isolation regions 18 located within the semiconductor substrate 12. Although two device regions are described and illustrated, the present invention can be employed when a plurality of device regions are present.

The initial structure 10 further includes a high k gate dielectric 20 located atop the semiconductor substrate 12 in both the first device region 14 and the second device region 16. The first device region 14 is either an nFET device region or a pFET device region, while the second device region 16 is the other of an nFET device region or a pFET device region.

The semiconductor substrate 12 is comprised of any semiconductor material including but not limited to Si, Ge, SiGe, SiC, SiGeC, GaAs, GaN, InAs, InP and all other III/V or II/VI compound semiconductors. Semiconductor substrate 12 can also comprise an organic semiconductor or a layered semiconductor such as Si/SiGe, a silicon-on-insulator (SOD, a SiGe-on-insulator (SGOI) or a germanium-on-insulator (GOI). In some embodiments of the present invention, it is preferred that the semiconductor substrate 12 be composed of a Si-containing semiconductor material, i.e., a semiconductor material that includes silicon. The semiconductor substrate 12 may be doped, undoped or contain doped and undoped regions therein. The semiconductor substrate 12 may include a single crystal orientation or it may include at least two coplanar surface regions that have different crystal orientations (the latter substrate is referred to in the art as a hybrid substrate). When a hybrid substrate is employed, an nFET is typically formed on a (100) crystal surface, while a pFET is typically formed on a (110) crystal plane. The hybrid substrate can be formed by techniques that are well known in the art. See, for example, co-owned U.S. Pat. No. 7,329,923, U.S. Publication No. 2005/0116290, dated Jun. 2, 2005 and U.S. Pat. No. 7,023,055, the entire contents of each are incorporated herein by reference.

The semiconductor substrate 12 may also include a first doped (n- or p-) region, and a second doped (n- or p-) region. For clarity, the doped regions are not specifically shown in any of the drawings of the present application. The first doped region and the second doped region may be the same, or they may have different conductivities and/or doping concentrations. These doped regions are known as "wells" and they are formed utilizing conventional ion implantation processes.

At least one isolation region 18 is typically formed into the semiconductor substrate 12. The at least one isolation region 18 may be a trench isolation region (as shown in FIG. 1) or a field oxide isolation region (not specifically shown in the drawings). The trench isolation region can be formed utilizing a conventional trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well. The field oxide may be fanned utilizing a so-called local oxidation of silicon process. Note that the at least one isolation region provides isolation between neighboring gate regions, typically required when the neighboring gates have opposite conductivities, i.e., nFETs and pFETs. The isolation region 18 is typically present between the various device regions of the substrate, i.e., between first device region 14 and second device region 16.

After processing the semiconductor substrate 12, a chemox layer (not shown) is optionally formed on the surface of the semiconductor substrate 12. The optional chemox layer is formed utilizing a conventional growing technique that is well known to those skilled in the art including, for example, oxidation or oxynitridation. In some embodiments, the chemox layer is formed by a wet chemical oxidation process. When the substrate 12 is a Si-containing semiconductor, the chemox layer is comprised of silicon oxide, silicon oxynitride or a nitrided silicon oxide. When the semiconductor substrate 12 is other than a Si-containing semiconductor, the chemox layer may comprise a semiconducting oxide, a semiconducting oxynitride or a nitrided semiconducting oxide. The thickness of the chemox layer is typically from 0.5 nm to 1.5 nm, with a thickness from 0.8 nm to 1 nm being more typical. The thickness, however, may be different after processing at higher temperatures, which are usually required during FET or CMOS fabrication.

High k gate dielectric 20 is formed atop the semiconductor substrate 12. In some embodiments, and as illustrated, the high k gate dielectric 20 can be formed directly on a surface of the semiconductor substrate 12. In other embodiments, the high gate dielectric 20 can be formed on a surface of the chemox layer described above. In some embodiments and as illustrated in FIG. 1, the high k gate dielectric 20 in both device regions is comprised of a same high k gate dielectric material. In other embodiments (not particularly illustrated), the high k gate dielectric in the first device region is composed of a different high k gate dielectric material than the high k gate dielectric in the second device region. When such an embodiment is employed, block masks can be used in providing different high k gate dielectric materials to the different device regions.

The high k gate dielectric 20 employed includes any dielectric metal oxide having a dielectric constant that is greater than the dielectric constant of silicon oxide, e.g., 3.9. Typically, the high k gate dielectric 20 that is employed has a dielectric constant greater than 4.0, with a dielectric constant of greater than 8.0 being even more typical. Exemplary high k dielectric materials include, but are not limited to $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $SrTiO_xN_y$, $LaAlO_xN_y$, $Y_2O_xN_y$, a silicate thereof, and an alloy thereof. Multilayered stacks of these high k materials can also be employed as the high k gate dielectric 20. Each value of x is independently from 0.5 to 3 and each value of y is independently from 0 to 2.

The thickness of the high k gate dielectric 20 may vary depending on the technique used to form the same. Typically, however, the high k gate dielectric 20 has a thickness from 0.5 nm to 10 nm, with a thickness from 1.0 nm to 5 nm being even more typical. The high k gate dielectric 20 employed may have an effective oxide thickness on the order of, or less than, 1 nm.

The high k gate dielectric 20 is formed by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), and other like deposition processes.

Figure 2:
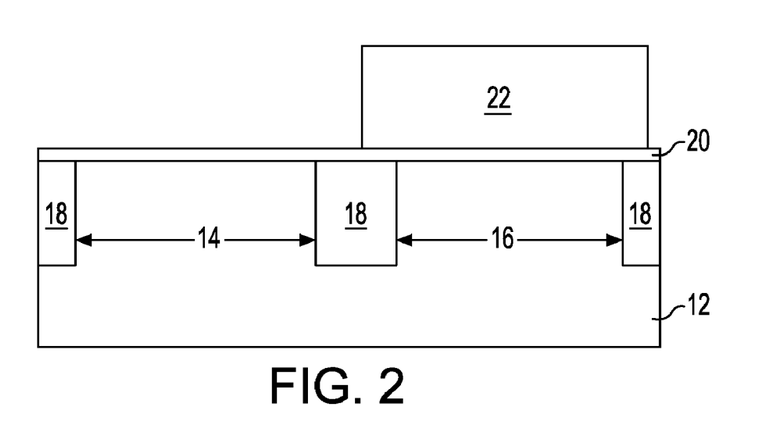
FIG. 2 is a pictorial representation (through a cross sectional view) depicting the structure of FIG. 1 after forming a first block mask on an upper surface of the high k gate dielectric within one device region of the substrate.

Referring to FIG. 2, there is illustrated the structure of FIG. 1 after forming a first block mask 22 on an upper surface of the high k gate dielectric 20 within one of the device regions. In the illustrated embodiment, the first block mask 20 is formed on an upper surface of the high k gate dielectric 20 that is within the second device region 16. In another embodiment (not illustrated), the first block mask 22 can be formed atop the high k gate dielectric 20 in the first device region 14. The first block mask 22 can be comprised of a hard mask, a photoresist or a combination thereof. In embodiments in which the first block mask 22 is comprised of a hard mask, the hard mask may include any conventional hard mask material including, but not limited to silicon oxide and/or silicon nitride. When the first block mask 22 is comprised of a photoresist, any conventional photoresist material that can serve as block mask can be employed in the present invention. In some embodiments, it is preferred to use a photoresist as a block mask material.

The first block mask 22 can be formed by techniques that are well known to those skilled in the art. In one embodiment, the first block mask 22 can be formed by blanket deposition of a layer of a block mask material across the upper surface of the high k gate dielectric 20 in both the first device region 14 and the second device region 16. Deposition of the layer of block mask material includes any known deposition process such as, for example, chemical vapor deposition (CVD), plasma enhanced chemical vapor deposition (PECVD), atomic layer deposition (ALD), physical vapor deposition (PVD), chemical solution deposition and spin-on coating. In some embodiments, a thermal growing technique such as oxidation and/or nitridation can be used in forming the blanket layer of block mask material.

Following deposition, the blanket layer of block mask material is patterned into first block mask 22. The patterning can include lithography alone or a combined lithography and etching process. Lithography alone is typically employed when the first block mask 22 is comprised only of a photoresist material. When the first block mask 22 includes a hard mask material, combined lithography and etching is typically employed. The term "lithography" is used herein to denote a process of exposing a photoresist material to a desired pattern of radiation and then developing the exposed resist material. The etching step used in patterning the blanket layer of the first block mask material includes dry etching, wet etching or a combination of dry etching and wet etching. Dry etching includes one of reactive ion etching (RIE), plasma etching, ion beam etching, and laser ablation. Wet etching includes the use of a chemical etchant.

The thickness of the first block mask 22 can vary depending on the type of block mask material employed, the number of layers within the first block mask 22, and the deposition technique that is employed in forming the same. Typically, the first block mask 22 has a thickness from 3 nm to 300 nm, with a thickness from 10 nm to 150 nm being more typical.

As shown in FIG. 2, the first block mask 22 protects the high k gate dielectric 20 within one of the device regions, while leaving the high k gate dielectric 20 exposed in the another device region.

Figure 3:
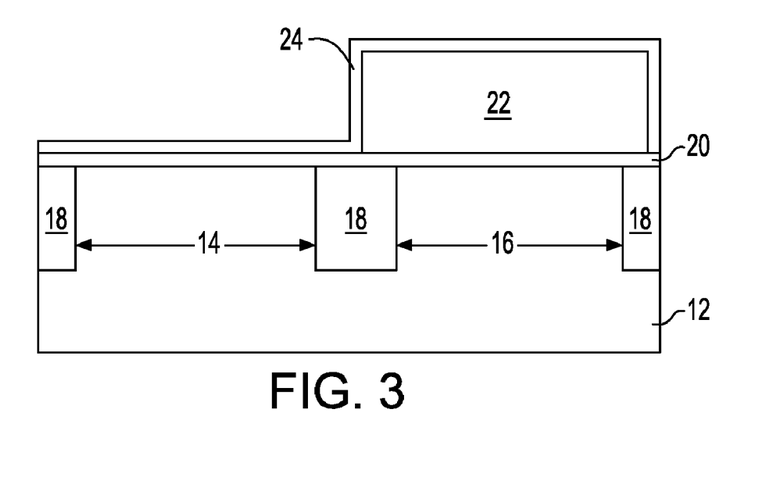
FIG. 3 is a pictorial representation (through a cross sectional view) depicting the structure of FIG. 2 after forming a first threshold voltage adjusting material on all exposed surfaces of the structure.

Referring now to FIG. 3, there is illustrated the structure of FIG. 2 after forming a first threshold voltage adjusting material 24 on all exposed surfaces of the structure. In particular, and as shown in FIG. 3, the first threshold voltage adjusting material 24 is formed atop the exposed upper surface of the high k gate dielectric 20 in one of the device regions not including the first block mask 22, as well as atop the first block mask 22 in the another device region including the first block mask 22; note also that a portion of the first threshold voltage adjusting material also forms on the exposed sidewalls of the first block mask 22.

The term "threshold voltage adjusting material" as used throughout the instant application denotes a material that moves the threshold voltage of a gate stack towards either an nFET or pFET band edge. The first threshold voltage adjusting material 24 employed may include an nFET threshold voltage adjusting material or a pFET threshold voltage adjusting material. The type of threshold voltage adjusting material employed in this step is dependent on which conductivity type device, e.g., nFET or pFET, is being fabricated within the specific device region.

One example of an nFET threshold voltage adjusting material that can be used as the first threshold voltage adjusting material 24 is a rare earth metal-containing material that comprises an oxide or nitride of at least one element from Group IIIB of the Periodic Table of Elements (CAS version) including, for example, La, Ce, Pr, Nd, Pm, Sm, Eu, Ga, Tb, Dy, Ho, Er, Tm, Yb, Lu or mixtures thereof. Preferably, the rare earth metal-containing material comprises an oxide of La, Ce, Y, Sm, Er and/or Tb, with $La_2O_3$ being more preferred.

The rare earth metal-containing material can be formed utilizing a conventional deposition process including, for example, evaporation, molecular beam deposition, metalorgano chemical vapor deposition (MOCVD), atomic layer deposition (ALD), physical vapor deposition (PVD), ionized PVD and other like deposition processes. In one embodiment of the present invention, the rare earth metal-containing material can be formed by placing the structure including the high k gate dielectric into the load-lock of a molecular beam deposition chamber, followed by pumping this chamber down to the range of $10^{-5}$ Torr to $10^{-8}$ Torr. After these steps, the structure is inserted, without breaking vacuum into the growth chamber where the rare earth metal-containing material such as La oxide is deposited by directing atomic/molecular beams of the rare earth metal and oxygen or nitrogen onto the structure's surface. Specifically, because of the low pressure of the chamber, the released atomic/molecular species are beamlike and are not scattered prior to arriving at the structure. A substrate temperature of about 300° C. is used. In the case of $La_2O_3$ deposition, the La evaporation cell is held in the temperature range of 1400° C. to 1700° C., and a flow rate of 1 sccm to 3 sccm of molecular oxygen is used. Alternatively, atomic or excited oxygen may be used as well, and this can be created by passing the oxygen through a radio frequency source excited in the range of 50 Watts to 600 Watts. During the deposition, the pressure within the chamber can be in the range from $1 \times 10^{-5}$ Torr to $8 \times 10^{-5}$ Torr, and the La oxide growth rate can be in the range from 0.1 nm per minute to 2 nm per minute, with a range from 0.5 nm per minute to 1.5 nm per minute being more typical.

Another example of an nFET threshold voltage adjusting material that can be employed as the first threshold voltage adjusting material 24 is an alkaline earth metal-containing material that comprises a compound having the formula $MA_x$ wherein M is an alkaline earth metal (Be, Mg, Ca, Sr, and/or Ba), A is one of O, S and a halide, and x is 1 or 2. Alkaline earth metal-containing compounds that include a mixture of alkaline earth metals and/or a mixture of anions, such as an oxychloride can also be used as an nFET threshold voltage adjusting material. Examples of alkaline earth metal-containing compounds that can be used include, but are not limited to MgO, MgS, $MgF_2$, $MgCl_2$, $MgBr_2$, $MgI_2$, CaO, CaS, $CaF_2$, $CaCl_2$, $CaBr_2$, $CaI_2$, SrO, SrS, $SrF_2$, $SrCl_2$, $SrBr_2$, $SrI_2$, BaO, BaS, $BaF_2$, $BaCl_2$, $BaBr_2$, and $BaI_2$. In one preferred embodiment of the present invention, the alkaline earth metal-containing compound includes Mg. MgO is a highly preferred alkaline earth metal-containing material employed in one embodiment of the present invention.

The alkaline earth metal-containing material can be formed utilizing a conventional deposition process including, for example, sputtering from a target, reactive sputtering of an alkaline earth metal under oxygen plasma conditions, electroplating, evaporation, molecular beam deposition, MOCVD, ALD, PVD, ionized PVD and other like deposition processes.

In addition to nFET threshold voltage adjusting materials, the first threshold voltage adjusting material 24 can alternatively be a pFET threshold voltage adjusting material. Examples of pFET threshold voltage adjusting materials include Al (and its compounds that are non-conductive such as, for example $Al_2O_3$), Ge (and its compounds that are non-conductive such as, for example $GeO_2$), and non-conductive compounds of Ti and Ta such as, $TiO_2$ and $Ta_2O_5$ respectively.

The pFET threshold voltage adjusting materials can be formed utilizing conventional deposition processes well known to those skilled in the art including, but not limited to chemical vapor deposition (CVD), plasma enhanced chemical vapor deposition (PECVD), chemical solution deposition, atomic layer deposition (ALD), physical vapor deposition (PVD), ionized PVD, sputtering and plating.

Notwithstanding the type of material used as the first threshold voltage adjusting material 24, the first threshold voltage adjusting material 24 has a thickness from 0.1 nm to 5.0 nm, with a thickness from 1.0 nm to 3.0 nm being more typical.

Figure 4:
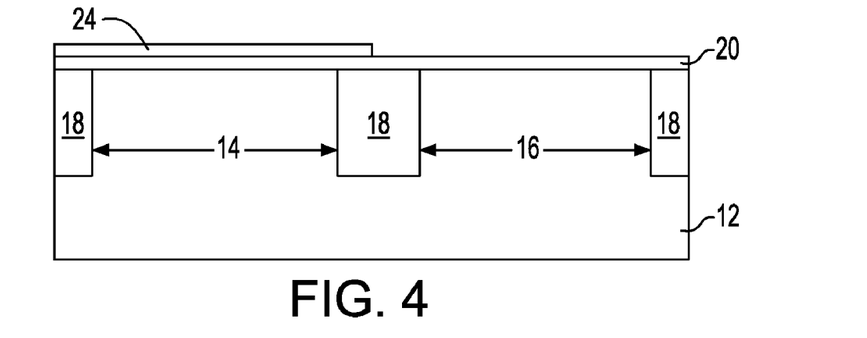
FIG. 4 is a pictorial representation (through a cross sectional view) depicting the structure of FIG. 3 after removing the first threshold voltage adjusting material and the first block mask from the one device region, while leaving a portion of the first threshold voltage adjusting material within another device region of the substrate.

Referring now to FIG. 4, there is shown the structure of FIG. 3 after removing the first threshold voltage adjusting material 24 and the first block mask 22 from the one device region, while leaving a portion of the first threshold voltage adjusting material 24 within another device region of the substrate. In particular, FIG. 4 illustrates a structure after removing the first threshold voltage adjusting material 24 and the first block mask 22 from the second device region 16. As shown in FIG. 4, a portion of the first threshold voltage adjusting material 24 remains in the first device region 14. The removal of the first threshold voltage adjusting material 24 and the underlying first block mask 22 from one of the device regions is performed utilizing any process that can selectively remove the first threshold voltage adjusting material 24 and the first block mask 22 from one of the device regions. In one embodiment, a photoresist stripping process such as, for example, ashing, can be used in removing the first threshold voltage adjusting material 24 and the first block mask 22 from one of the device regions. In another embodiment, solvent strip chemistry can be used in removing the first threshold voltage adjusting material 24 and the first block mask 22 from one of the device regions.

Figure 5:
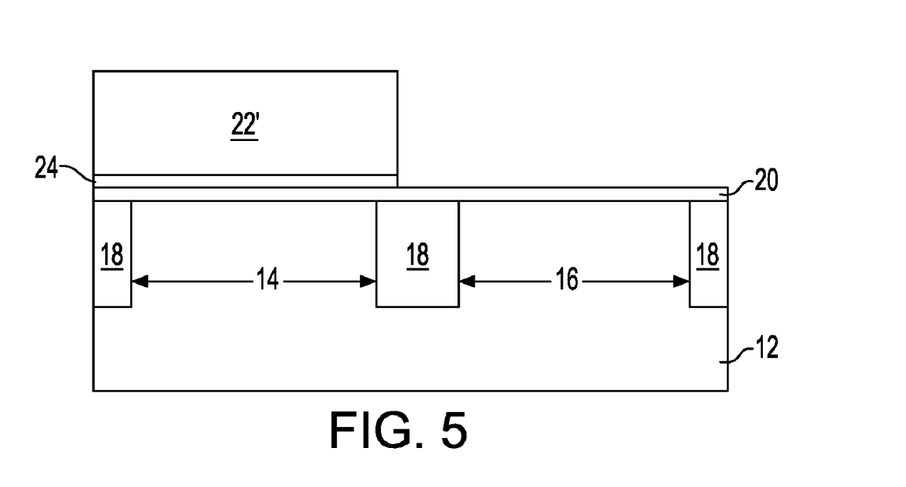
FIG. 5 is a pictorial representation (through a cross sectional view) depicting the structure of FIG. 4 after forming a second block mask atop the first threshold voltage adjusting material remaining within the another device region.

Referring now to FIG. 5, there is shown the structure of FIG. 4 after forming a second block mask 22' within the device region that includes the remaining portion of the first threshold voltage adjusting material 24. In particular, FIG. 5 shows a second block mask 22' located atop the first threshold voltage adjusting material 24 within the first device region 14. In the other device region, an upper surface of the high k gate dielectric 20 is exposed.

The second block mask 22' can be comprised of one of the materials used in forming the first block mask 22. Also, the second block mask 22' can be formed utilizing one of the techniques mentioned above in forming the first block mask 22. The thickness of the second block mask 22' is within the thickness range mentioned above for the first block mask 22.

Figure 6:
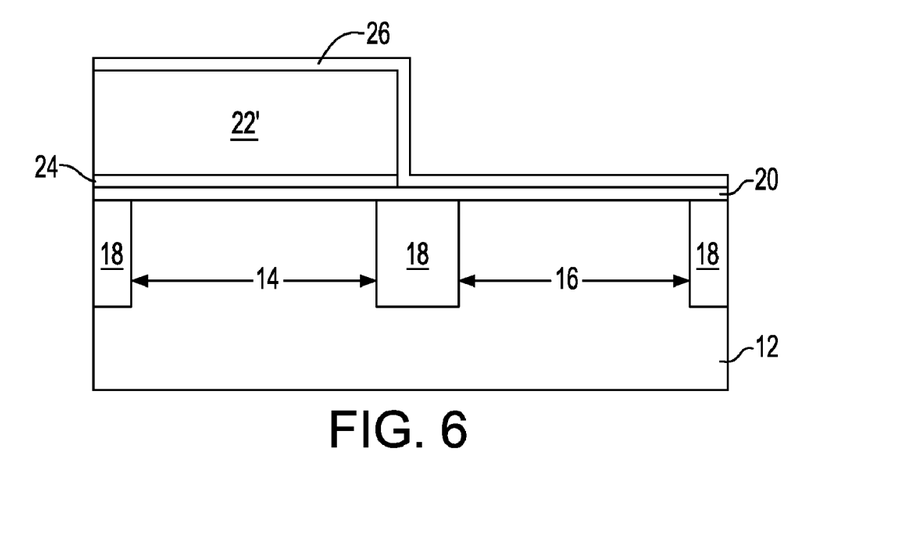
FIG. 6 is a pictorial representation (through a cross sectional view) depicting the structure of FIG. 5 after forming a second threshold voltage adjusting material on all exposed surfaces of the structure.

Referring now to FIG. 6, there is illustrated the structure of FIG. 5 after forming a second threshold voltage adjusting material 26 atop all exposes surfaces of the structure. In particular, the second threshold voltage adjusting material 26 is formed atop the exposed high k gate dielectric 20 in one of the device regions, and atop and on sidewalls of the second block mask 22' in the another device region that is being protected by the second block mask 22'.

The second threshold voltage adjusting material 26 shown in FIG. 6 is the other of the nFET or pFET threshold voltage adjusting material not employed as the first threshold voltage adjusting material 24. That is, when the first threshold voltage adjusting material 24 is a pFET threshold voltage adjusting material, the second threshold voltage adjusting material 26 is an nFET threshold voltage adjusting material. Conversely, when the first threshold voltage adjusting material 24 is an nFET threshold voltage adjusting material, the second threshold voltage adjusting material 26 is a pFET threshold voltage adjusting material.

The second threshold voltage adjusting material 26 is applied utilizing one of the techniques described above in respect to the first threshold voltage adjusting material 24. The thickness of the second threshold voltage adjusting material 26 is within the range recited above for the first threshold voltage adjusting material 24.

Figure 7:
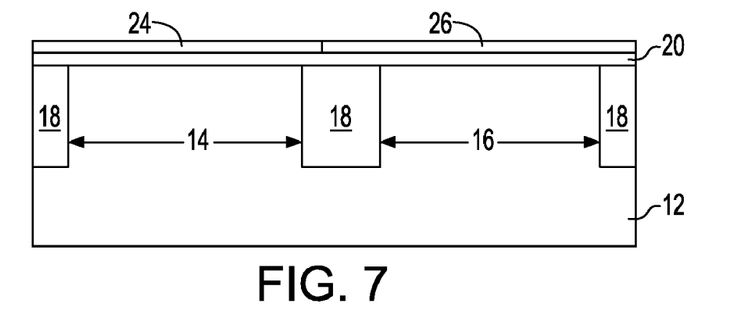
FIG. 7 is a pictorial representation (through a cross sectional view) depicting the structure of FIG. 6 after removing the second threshold voltage adjusting material and the second block mask from the another device region, while leaving a portion of the second threshold voltage adjusting material within the one device region of the substrate.

Referring now to FIG. 7, there is illustrated the structure of FIG. 6 after removing the second threshold voltage adjusting material 26 and the second block mask 22' from the one device region, while leaving a portion of the second threshold voltage adjusting material 26 within another device region of the substrate. In particular, FIG. 7 illustrates a structure after removing the second threshold voltage adjusting material 26 and the second block mask 22' from the first device region 14. As shown in FIG. 7, a portion of the second threshold voltage adjusting material 26 remains in the second device region 16. The removal of the second threshold voltage adjusting material 26 and the underlying second block mask 22' from one of the device regions is performed utilizing any process that can selectively remove the second threshold voltage adjusting material 26 and the second block mask 22' from one of the device regions. In one embodiment, a photoresist stripping process such as, for example, ashing, can be used in removing the second threshold voltage adjusting material 26 and the second block mask 22' from one of the device regions. In another embodiment, solvent strip chemistry can be used in removing the second threshold voltage adjusting material 26 and the second block mask 22' from one of the device regions.

Figure 8:
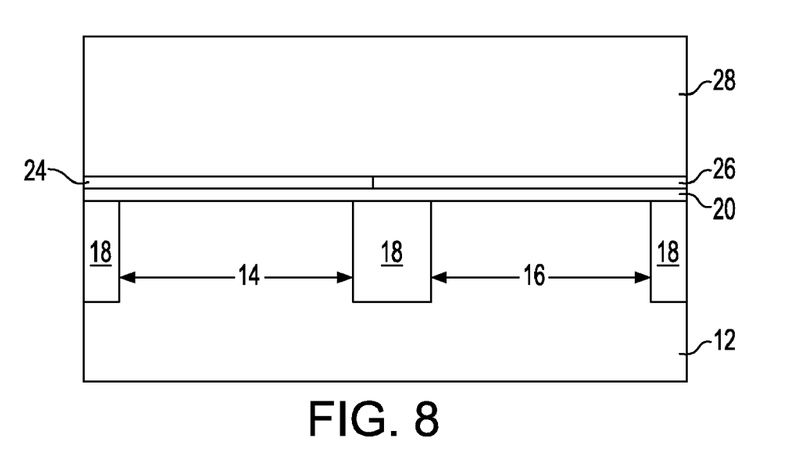
FIG. 8 is a pictorial representation (through a cross sectional view) depicting the structure of FIG. 7 after forming a conductive material on all exposed surfaces.

Referring now to FIG. 8, there is shown the structure of FIG. 7 after forming a conductive material 28 atop the remaining first and second threshold voltage adjusting materials (24 and 26) present in the different device regions. The conductive material 28 that is employed may comprise any conductive material including, but not limited to polycrystalline silicon, polycrystalline silicon germanium, an elemental metal, (e.g., tungsten, titanium, tantalum, aluminum, nickel, ruthenium, palladium and platinum), an alloy of at least one elemental metal, an elemental metal nitride (e.g., tungsten nitride, aluminum nitride, and titanium nitride), an elemental metal silicide (e.g., tungsten silicide, nickel silicide, and titanium silicide) and multilayers thereof. Preferably, the conductive material 28 that is formed atop the remaining threshold voltage adjusting materials (24 and 26) includes at least an elemental metal. In one embodiment of the present invention, a single layer of conductive material is formed. In another embodiment of the present invention, a first layer of conductive material and a second layer of conductive material are formed. In a preferred embodiment, conductive material 28 includes a stack, from bottom to top, of a conductive metal layer and an upper conductive Si-containing material layer; the conductive metal layer has a higher conductivity than the conductive Si-containing material layer. In some embodiments and as illustrated in FIG. 8, the conductive material 28 is comprised of the same conductive material in both device regions. In yet other embodiments (not shown), the conductive material in the first device region is comprised of a different conductive material than the conductive material in the second device region. Such an embodiment can be obtained utilizing block masks technology.

The conductive material 28 can be formed utilizing a conventional deposition process including, for example, chemical vapor deposition (CVD), plasma enhanced chemical vapor deposition (PECVD), evaporation, physical vapor deposition (PVD), sputtering, chemical solution deposition, atomic layer deposition (ALD) and other liked deposition processes. When Si-containing materials are used as the conductive material 28, the Si-containing materials can be doped within an appropriate impurity by utilizing either an in-situ doping deposition process or by utilizing deposition, followed by a step such as ion implantation in which the appropriate impurity is introduced into the Si-containing material. When a metal silicide is formed, a conventional silicidation process is employed.

The as deposited conductive material 28 typically has a thickness from 10 nm to 1000 nm, with a thickness from 50 nm to 500 nm being more typical.

In some embodiments, an optional hard mask material (not shown) can be formed atop the conductive material 28. The optional hard mask material includes an oxide, a nitride, an oxynitride or any combination thereof including multilayered stacks. When present, the optional hard mask material is formed utilizing a conventional deposition process well known to those skilled in the art including, for example, CVD and PECVD. Alternatively, the optional hard mask material is formed by a thermal process such as, for example, oxidation and/or nitridation. The thickness of the optional hard mask material may vary depending on the exact hard mask material employed as well as the process that is used in forming the same. Typically, the hard mask material has a thickness from 5 nm to 200 nm, with a thickness from 10 nm to 50 nm being more typical. The hard mask material is typically employed when the conductive material is a Si-containing material such as polysilicon or SiGe.

Figure 9:
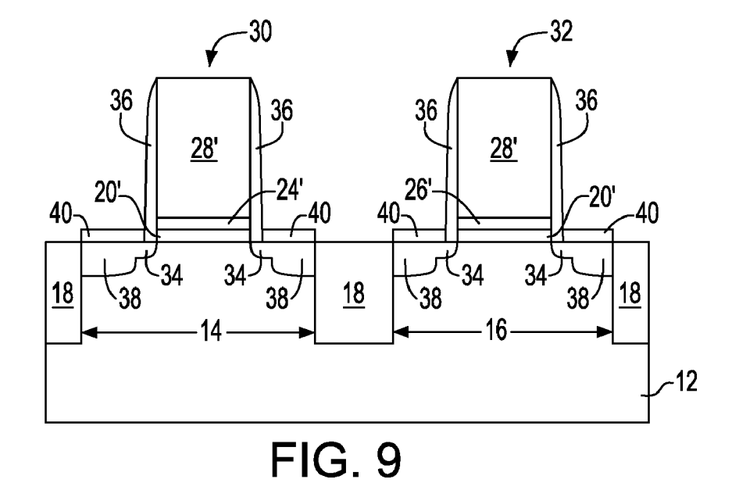
FIG. 9 is a pictorial representation (through a cross sectional view) depicting the structure of FIG. 8 after the formation of a patterned gate stack within each of the device regions and further CMOS device fabrication.

Referring now to FIG. 9, there is shown the structure of FIG. 8 after patterning the material stack in each of the device regions and after further CMOS device fabrication steps have been performed. The material stack including the high k gate dielectric 20, the first threshold voltage adjusting material 24 and the conductive material 28 in one of the device regions, and the material stack including the high k gate dielectric 20, the second threshold voltage adjusting material 26 and the conductive material 28 in the another device region are patterned by lithography and etching to form a first patterned gate stack 30 in the first device region 14 and a second patterned gate stack 32 in the second device region 16.

The first patterned gate stack 30 includes, from bottom to top, patterned high k gate dielectric 20', patterned first threshold voltage adjusting layer 24', and patterned conductive material 28'. The second patterned gate stack 32 includes, from bottom to top, patterned high k gate dielectric 20', patterned second threshold voltage adjusting material 26', and patterned conductive material 28'. An optional patterned hard mask can be located atop each of the patterned conductive materials 28'. The structure including the patterned gate stacks is shown in FIG. 9. In some embodiments (not shown), species from the patterned first threshold voltage adjusting layer 24' and the patterned second threshold voltage adjusting layer 26' may diffuse into at least one material layer that is located above and/or beneath layers 24' and 26'.

FIG. 9 also shows a structure after further CMOS device processing steps have been performed. The further CMOS device processing steps can include extension region 34 formation, spacer 36 formation, source/drain region 38 formation, and formation of metal semiconductor alloy contacts 40 atop at least each of the source/drain regions 38. In some embodiments of the invention, the patterned hard mask atop each of the patterned gate stacks can be removed prior to forming the contacts 40 such that a metal semiconductor alloy contact can be formed atop the patterned conductive material 28'.

The extension regions 34 are formed utilizing any known extension ion implantation process. After the extension ion implantation, an anneal can be used to activate the implanted extension ions. The spacer 36 is formed utilizing any known process including deposition of a spacer material, followed by etching. Typical spacer materials include an oxide and/or a nitride.

After formation of the spacer 36, source/drain regions 38 are formed into an upper exposed surface of the substrate at the footprint of each of the patterned gate stacks. The source/drain regions 38 are formed utilizing a source/drain ion implantation process followed by annealing. The metal semiconductor alloy contacts 40 are formed utilizing any process that is capable of forming a metal semiconductor alloy atop a semiconductor material. In one embodiment of the invention, the metal semiconductor alloy contacts 40 are formed utilizing a silicide process. The silicide process can be self-aligned to the outer edge of the spacer 36. The silicide process includes forming a metal capable of forming a metal semiconductor alloy when reacted with a semiconductor material. The metal used in forming the metal semiconductor alloy contact 40 can include, but is not limited to tantalum, titanium, tungsten, ruthenium, cobalt, nickel, or any suitable combination of those materials. A diffusion barrier such as titanium nitride or tantalum nitride can be formed atop the metal. An anneal is performed that causes reaction between the metal and the underlying semiconductor material forming metal semiconductor alloy regions. Typically, the anneal is performed at a temperature of at least 250° C. or above. A single anneal step or multiple anneal steps can be used. Any non-reacted metal and the optional diffusion barrier are removed after the anneal has been performed. In some embodiments, a metal semiconductor alloy contact can be formed directly atop the patterned conductive material 28', when no optional patterned hard mask is present and the conductive material is composed of a Si-containing material.

Referring now to FIGS. 10-18, there is shown a second embodiment of the present invention in which threshold voltage patterning is performed prior to formation of a high k gate dielectric.

Figure 10:
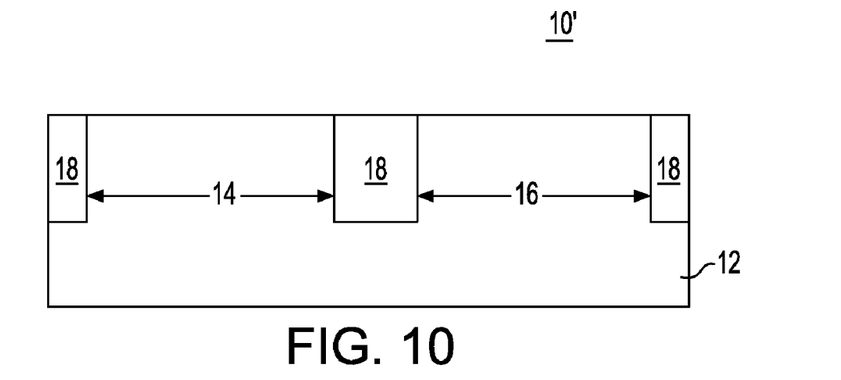
FIG. 10 is a pictorial representation (through a cross sectional view) depicting an initial structure including a semiconductor substrate having at least two device regions that can be employed in a second embodiment of the invention.

In the second embodiment, an initial structure 10' such as shown in FIG. 10 can be employed. The initial structure 10' includes a semiconductor substrate 12 having at least a first device region 14 and at least a second device region 16. At least one isolation region 18 can also be present within the semiconductor substrate 12 as shown in FIG. 10. The initial structure 10' illustrated in FIG. 10 includes materials that were mentioned above for the initial structure 10 shown in FIG. 1 except that no high k gate dielectric is present on the upper surface of the semiconductor substrate 12. Although FIG. 10 illustrates that semiconductor substrate 12 has a bare upper surface, the second embodiment also can utilize an initial structure in which an optional chemox layer is present on the upper surface of the semiconductor substrate 12. The semiconductor substrate 12 illustrated in FIG. 10 can be processed as described above for the semiconductor substrate 12 shown in FIG. 1.

Figure 11:
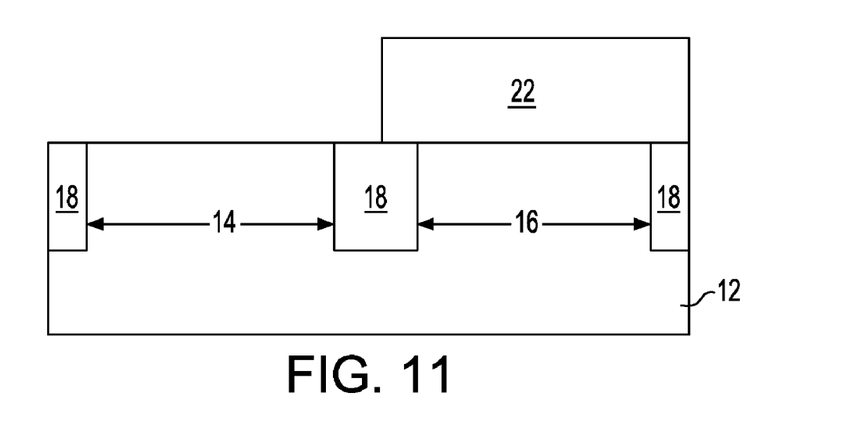
FIG. 11 is a pictorial representation (through a cross sectional view) depicting the initial structure of FIG. 10 after forming a first block mask atop an upper surface of the initial structure in one of the device regions.

Referring now to FIG. 11, there is illustrated the structure of FIG. 10 after forming a first block mask 22 atop an upper surface of the semiconductor substrate in one of the device regions, while leaving the upper surface of the semiconductor substrate 12 in another device region exposed. The first block mask 22 can be comprised of one of the block mask materials mentioned above in the first embodiment of the invention and it can be formed utilizing the processing also described in the first embodiment of the invention. The location of the first block mask 22 may vary and is not limited to the embodiment depicted in FIG. 11.

Figure 12:
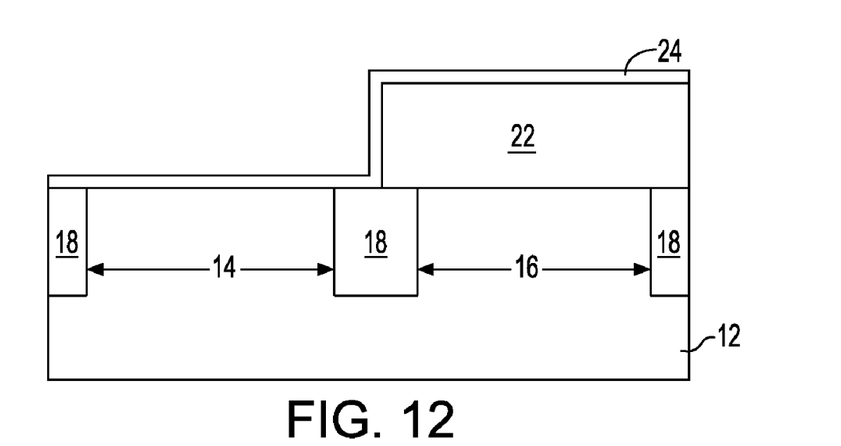
FIG. 12 is a pictorial representation (through a cross sectional view) depicting the structure of FIG. 11 after forming a first threshold voltage adjusting material on all exposed surfaces of the structure.

Referring now to FIG. 12, there is illustrated the structure of FIG. 11 after forming a first threshold voltage adjusting material 24 on all exposed surfaces of the structure shown in FIG. 11. The first threshold voltage adjusting material 24 employed in the second embodiment of the present invention can be comprised of one of the threshold voltage adjusting materials mentioned above for the first threshold voltage adjusting material 24 in the first embodiment of the present invention. The first threshold voltage adjusting material 24 of the second embodiment can be formed utilizing one of the processing techniques used in the first embodiment for forming the first threshold voltage adjusting material.

Figure 13:
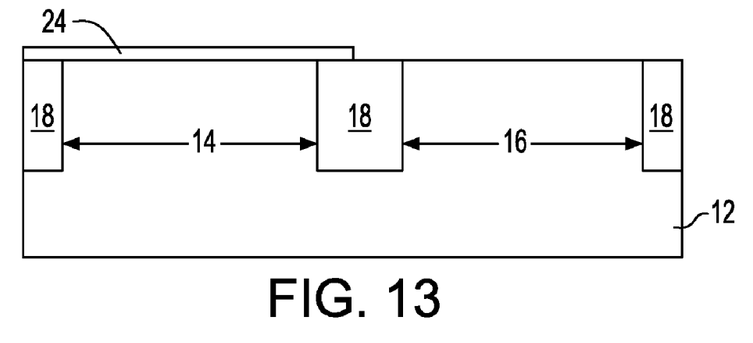
FIG. 13 is a pictorial representation (through a cross sectional view) depicting the structure of FIG. 12 after removing the first threshold voltage adjusting material and the first block mask from the one device region, while leaving a portion of the first threshold voltage adjusting material within another device region of the substrate.

Referring to FIG. 13, there is illustrated the structure of FIG. 12 after removing the first threshold voltage adjusting material 24 and the first block mask 22 from one of the device regions, while maintaining the first threshold voltage adjusting material 24 in the another device region. The selective removal of the first threshold voltage adjusting material 24 and the first block mask 22 from one of the device regions can be achieved utilizing one of the techniques used in the first embodiment of the invention for selectively removing those materials from the structure.

Figure 14:
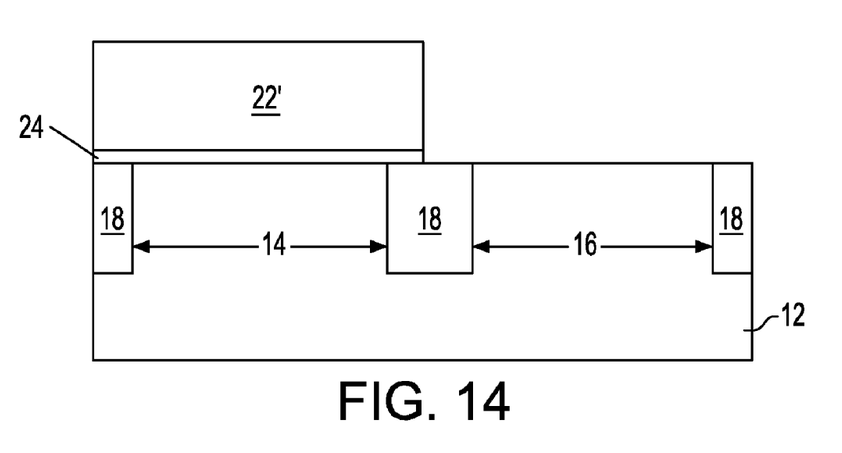
FIG. 14 is a pictorial representation (through a cross sectional view) depicting the structure of FIG. 13 after forming a second block mask atop the first threshold voltage adjusting material remaining within the another device region.

Referring now to FIG. 14, there is illustrated the structure of FIG. 13 after forming a second block mask 22' atop the first threshold voltage adjusting material 24 that remained in one of the device regions. The second block mask 22' can be comprised of one of the block mask materials mentioned above in the first embodiment of the invention and it can be formed utilizing the processing also described in the first embodiment of the invention.

Figure 15:
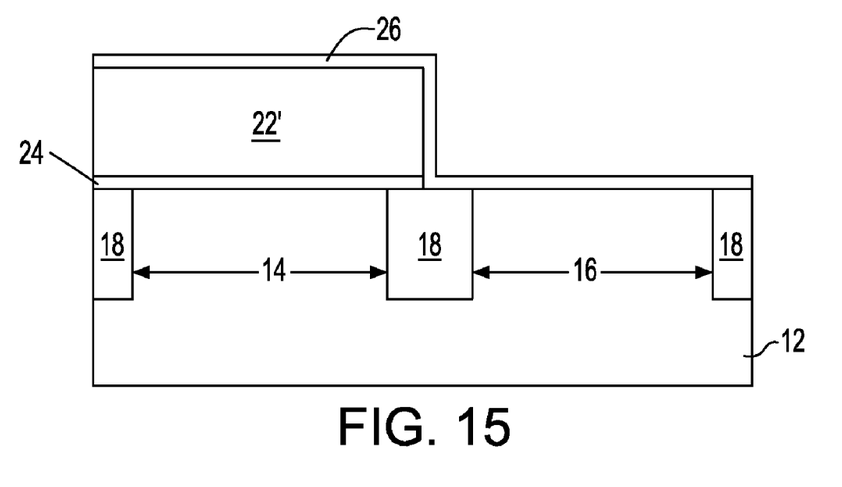
FIG. 15 is a pictorial representation (through a cross sectional view) depicting the structure of FIG. 14 after forming a second threshold voltage adjusting material on all exposed surfaces of the structure.

Referring now to FIG. 15, there is illustrated the structure of FIG. 14 after forming a second threshold voltage adjusting material 26 on all exposed surfaces of the structure shown in FIG. 14. The second threshold voltage adjusting material 26 can be comprised of one of the threshold voltage adjusting materials described above in the first embodiment and it can be formed also utilizing one of the processing techniques mentioned above in the first embodiment as well.

Figure 16:
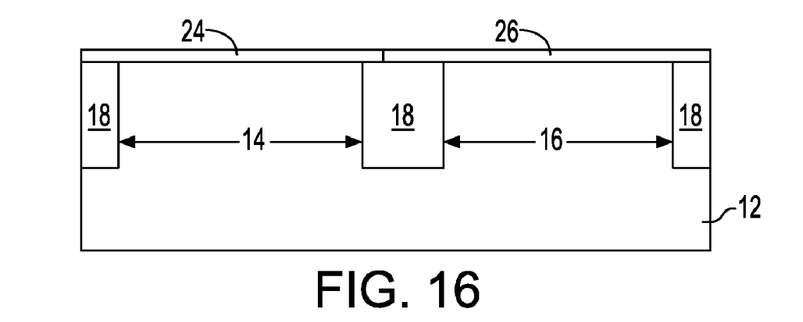
FIG. 16 is a pictorial representation (through a cross sectional view) depicting the structure of FIG. 15 after removing the second threshold voltage adjusting material and the second block mask from the another device region, while leaving a portion of the second threshold voltage adjusting material within the one device region of the substrate.

Referring now to FIG. 16, there is illustrated the structure of FIG. 15 after removing the second threshold voltage adjusting material 26 and the second block mask 22' from one of the device regions, while maintaining the second threshold voltage adjusting material 26 in another device region. The selective removal of the second threshold voltage adjusting material 26 and the second block mask 22' from one of the device regions can be achieved utilizing one of the techniques used in the first embodiment of the invention for selectively removing those materials from the structure.

Figure 17:
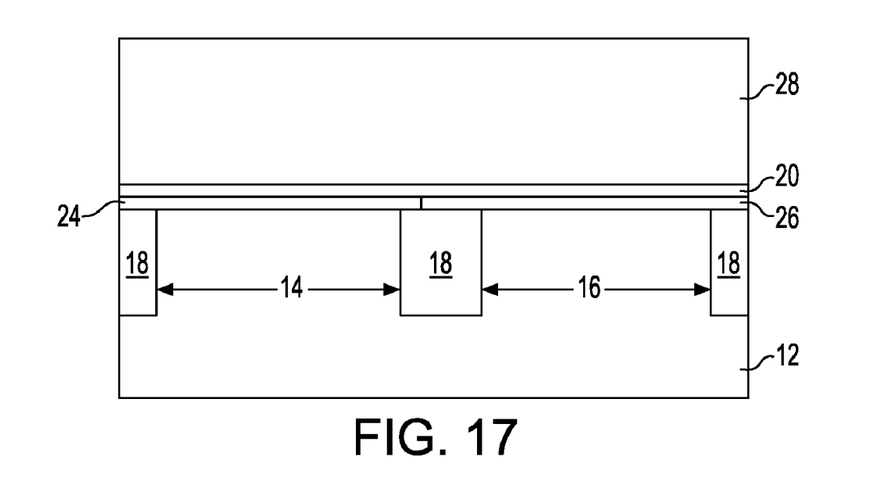
FIG. 17 is a pictorial representation (through a cross sectional view) depicting the structure of FIG. 16 after forming a stack of a high k gate dielectric and a conductive material on all exposed surfaces.

Referring now to FIG. 17, there is illustrated the structure of FIG. 16 after forming a stack including, from bottom to top, a high k gate dielectric 20 and a conductive material 28 atop the first threshold voltage adjusting material 24 in one device region and atop the second threshold voltage adjusting material 26 in another device region. The high k gate dielectric 20 of this embodiment can be comprised of one of the high k gate dielectrics mentioned in the first embodiment and the high k gate dielectric 20 used in this embodiment can be formed as mentioned above in the first embodiment. The high k gate dielectric 20 may be comprised of the same high k gate dielectric material in the various device regions, or the high k gate dielectric 20 in each device region may be comprised of a different high k gate dielectric material. When different high k gate dielectrics are employed block mask technology can be used to selectively form the different high k gate dielectric materials within the different device regions. The conductive material 28 of this embodiment can be comprised of one of the conductive materials mentioned in the first embodiment and the conductive material 28 used in this embodiment can be formed as mentioned above in the first embodiment. The conductive material 28 can be comprised of the same conductive material in the various device regions, or the conductive material 28 in each device region may be comprised of a different conductive material. When different conductive materials are employed block mask technology can be used to selectively form the different conductive materials within the different device regions.

Figure 18:
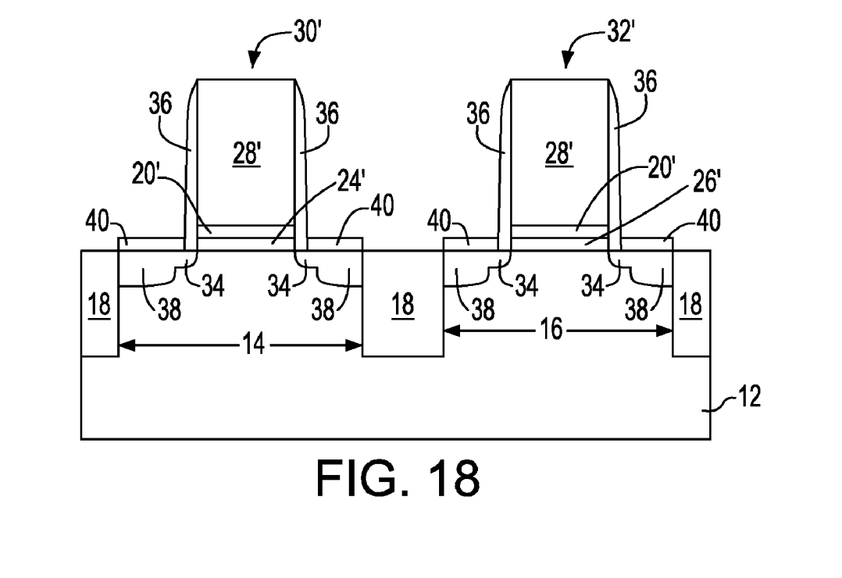
FIG. 18 is a pictorial representation (through a cross sectional view) depicting the structure of FIG. 17 after the formation of a patterned gate stack within each of the device regions and further CMOS device fabrication.

Referring now to FIG. 18, there is shown the structure of FIG. 17 after gate patterning and further CMOS process. The gate patterning and further CMOS process used in the second embodiment can include the gate patterning and further CMOS processing used in the first embodiment. Specifically, FIG. 18 shows a first patterned gate stack 30' including, from bottom to top, a patterned first threshold voltage adjusting material 24', a patterned high k gate dielectric 20' and a patterned conductive material 28' and a second patterned gate stack 32' including, from bottom to top, a patterned second threshold voltage adjusting material 26', a patterned high k gate dielectric 20', and a patterned conductive material 28'. The structure shown in FIG. 18 also includes extension regions 34, source/drain regions 38, spacer 26 and metal semiconductor alloy contacts 40 which are each comprised of materials and/or formed as described above in the first embodiment of the invention.

Reference is now made to FIGS. 19-25 which illustrate a third embodiment of the present invention. In the third embodiment of the invention, a method of fabricating a complementary metal oxide semiconductor (CMOS) structure with tunable threshold voltage is disclosed in which some threshold voltage adjusting materials are selectively formed prior to the formation of a high k gate dielectric and other threshold voltage adjusting materials are selectively formed after formation of the high k gate dielectric such that some threshold voltage adjusting material are located beneath the high k gate dielectric and other threshold voltage adjusting materials are formed atop the high k gate dielectric.

Figure 19:
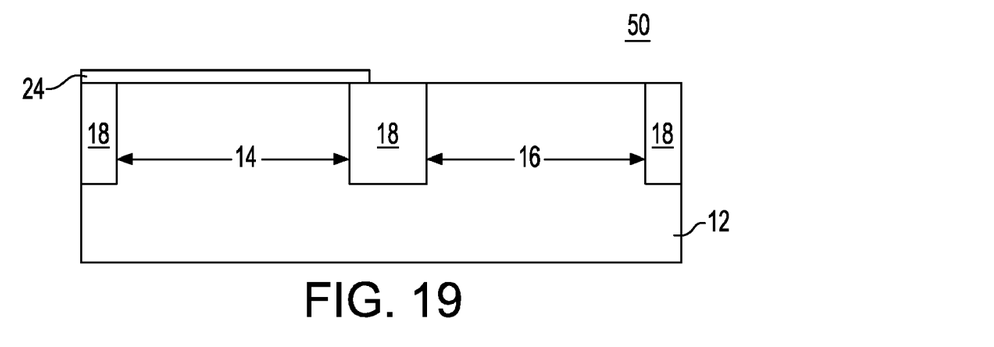
FIG. 19 is a pictorial representation (through a cross sectional view) depicting an initial structure that can be employed in a third embodiment of the invention including a first threshold voltage adjusting material located atop a surface of a semiconductor substrate in one device region, while the upper surface of the semiconductor substrate in the another device region is exposed.

Reference is first made to FIG. 19 which illustrates an initial structure 50 that can be employed in a third embodiment of the invention. The initial structure 50 includes a first threshold voltage adjusting material 24 located atop a surface of a semiconductor substrate 12 in one device region, e.g., first device region 14, while the upper surface of the semiconductor substrate 12 in another device region, e.g., second device region 16, is exposed. The semiconductor substrate 12 used in the third embodiment is comprised of one of the semiconductor materials mentioned above for substrate 12 in the first embodiment. The semiconductor substrate 12 can be processed as disclosed above in the first embodiment as well. In some embodiments, the semiconductor substrate 12 can include an optional chemox layer thereon in both device regions.

The first threshold voltage adjusting material 24 includes one of the materials mentioned above for the first threshold voltage adjusting material 24 in the first embodiment. The first threshold voltage adjusting material 24 is formed by first providing a first block mask (not specifically shown) to one of the device regions, forming the threshold voltage adjusting material 24 on all exposed surfaces and then selectively removing the first threshold voltage adjusting material 24 and the first block mask from one of the device regions. The first block mask employed in the third embodiment can include one of the first block mask materials used in the first embodiment of the invention and it can be formed as described in the first embodiment as well. The first threshold voltage adjusting material 24 can be comprised of one of the threshold voltage adjusting materials mentioned above in the first embodiment and it can be formed utilizing one of the processes mentioned above as well. The selective removal of the first threshold voltage adjusting material and the first block mask from one of the device regions, while maintaining the first threshold voltage adjusting material 24 in another device can be performed utilizing one of the selective removal processes mentioned above in regard to the first embodiment.

Figure 20:
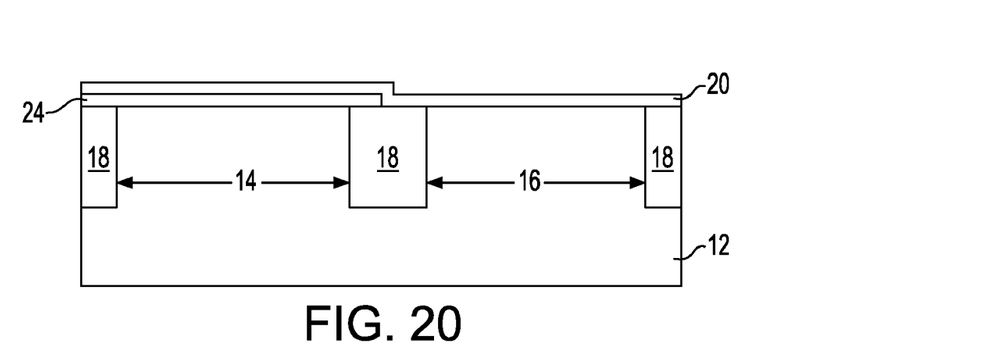
FIG. 20 is a pictorial representation (through a cross sectional view) depicting the structure of FIG. 19 after forming a high k gate dielectric on all exposed surfaces of the structure.

Reference is now made to FIG. 20 which illustrates the structure of FIG. 19 after forming a high k gate dielectric 20 all exposed surfaces of the structure. The high k gate dielectric 20 can be comprised of one of the materials mentioned above for the high k gate dielectric in the first embodiment and it can be formed utilizing one of the techniques described above in the first embodiment as well.

Figure 21:
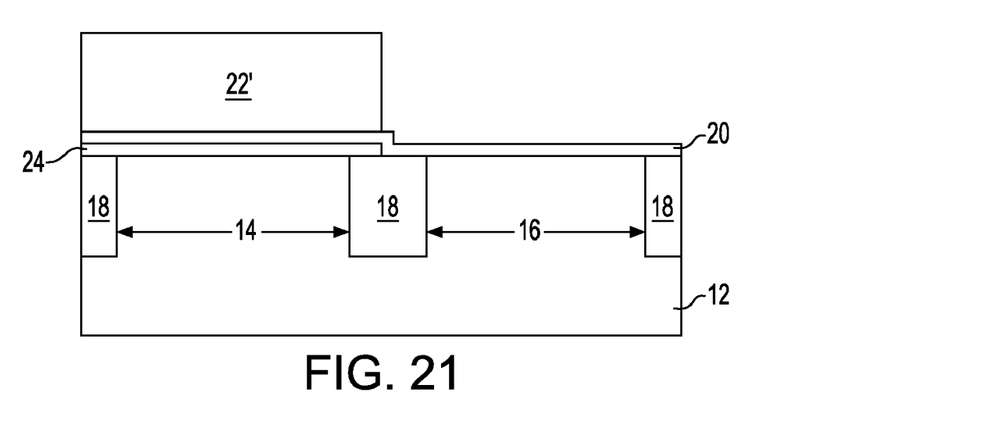
FIG. 21 is a pictorial representation (through a cross sectional view) depicting the structure of FIG. 20 after forming a block mask atop the high k gate dielectric that is located atop the first threshold voltage adjusting material.

Referring now to FIG. 21, there is illustrated the structure of FIG. 20 after forming a second block mask 22' atop the high k dielectric that is located atop the first threshold voltage adjusting material 24. The second block mask 22' employed in this embodiment can be comprised of one of the second block mask materials used in the first embodiment and it can be formed utilizing the technique described above in the first embodiment.

Figure 22:
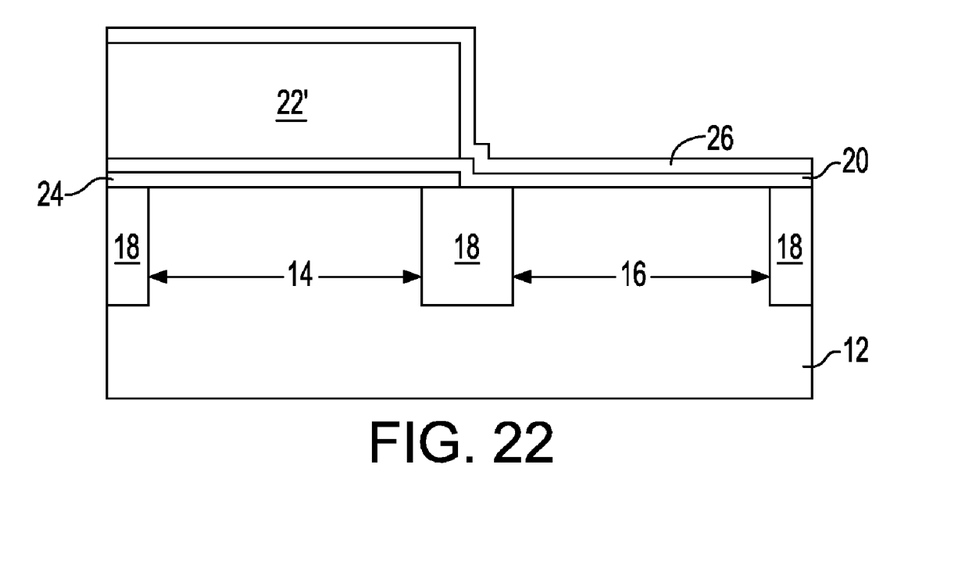
FIG. 22 is a pictorial representation (through a cross sectional view) depicting the structure of FIG. 21 after formation of a second threshold voltage adjusting material atop all exposed surfaces of the structure.

Referring now to FIG. 22, there is illustrated the structure of FIG. 21 after formation of a second threshold voltage adjusting material 26 atop all exposed surfaces of the structure. The second threshold voltage adjusting material 26 can be comprised of one of the second threshold voltage adjusting materials mentioned above in the first embodiment and it can be fabricated utilizing one of the techniques mentioned in the first embodiment as well.

Figure 23:
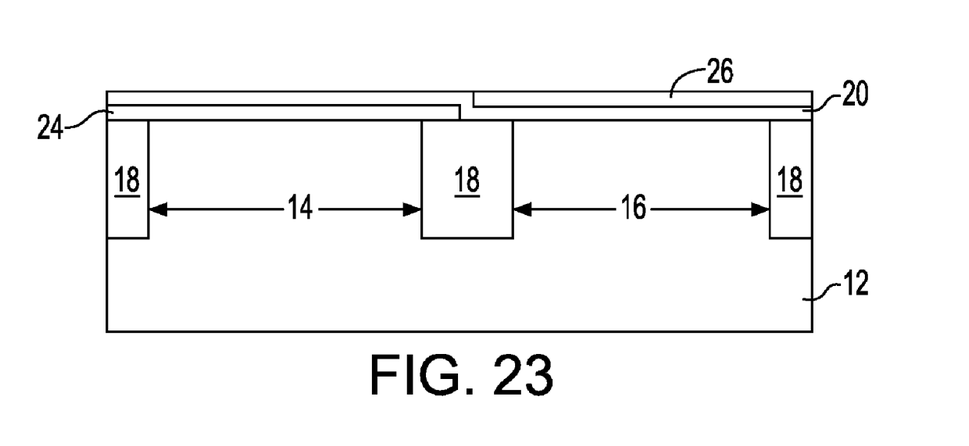
FIG. 23 is a pictorial representation (through a cross sectional view) depicting the structure of FIG. 22 after removing the second threshold voltage adjusting material and the block mask from one of the device regions, while leaving the second threshold voltage adjusting material atop the high gate k dielectric in the another device region.

Referring now to FIG. 23, there is illustrated the structure of FIG. 22 after removing the second threshold voltage adjusting material 24 and the second block mask 22' from one of the device regions, while leaving the second threshold voltage adjusting material 24 atop the high gate k dielectric 20 in another device region. This step of the present invention is performed utilizing one of the techniques mentioned above in the first embodiment as well.

Figure 24:
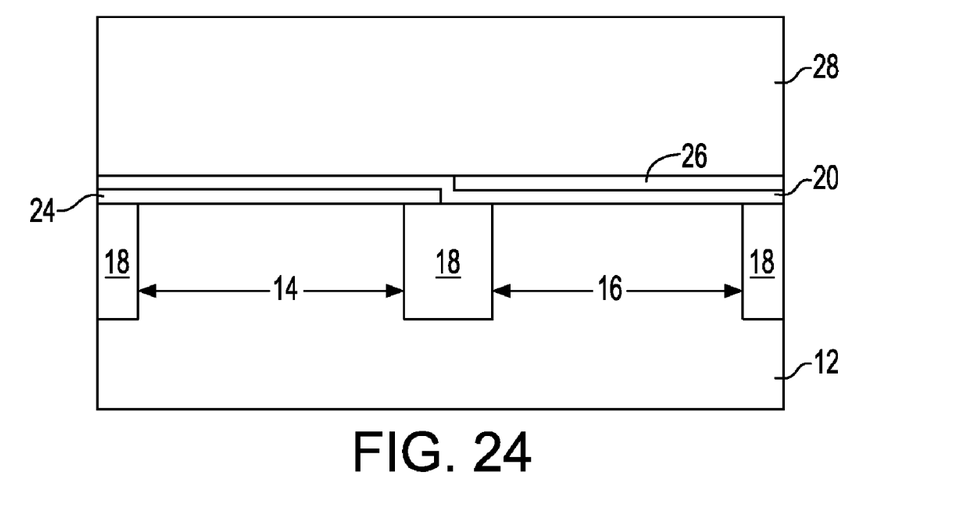
FIG. 24 is a pictorial representation (through a cross sectional view) depicting the structure of FIG. 23 after forming of a conductive material atop all exposed surfaces of the structure.

Referring now to FIG. 24, there is illustrated the structure of FIG. 23 after forming a conductive material 28 atop all exposed surfaces of the structure. The conductive material 28 can be comprised of one of the conductive materials mentioned above in the first embodiment and it can be formed utilizing one of the techniques mentioned above as well.

Figure 25:
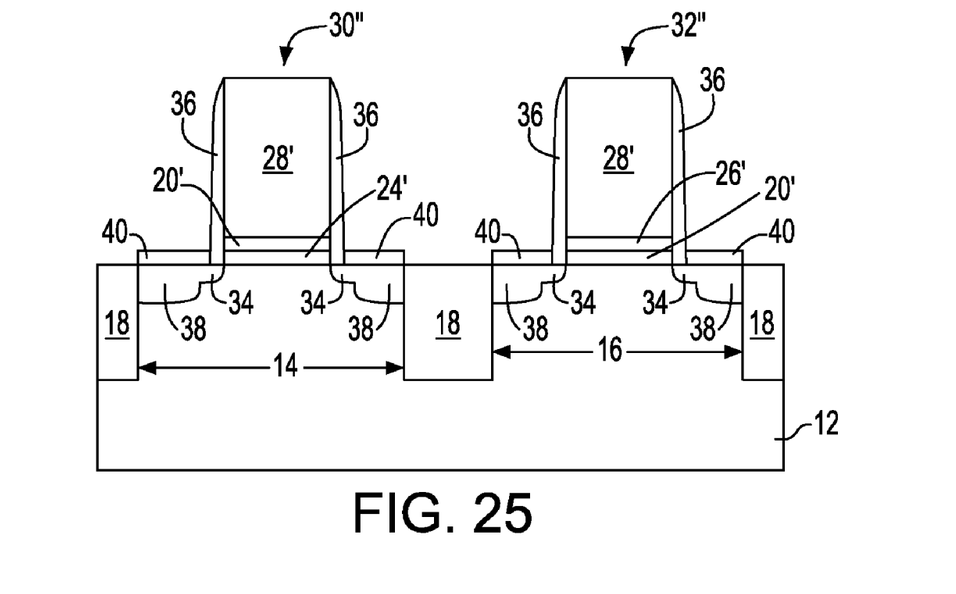
FIG. 25 is a pictorial representation (through a cross sectional view) depicting the structure of FIG. 24 after gate patterning and further CMOS processing.

Referring to FIG. 25, there is illustrated the structure of FIG. 24 after gate patterning and further CMOS processing. The details concerning the gate patterning and the further CMOS processing are described in the first embodiment. In the illustrated structure, a first patterned gate stack 30" is provided that includes, from bottom to top, a patterned first threshold voltage adjusting material 24', a patterned high k dielectric 20', and a patterned conductive material 28', and a second patterned gate stack 32" is provided that includes, from bottom to top, a patterned high k gate dielectric 20', a patterned second threshold voltage adjusting material 26' and a patterned conductive material 28'. The structure further includes extension regions 34, source/drain regions 38, spacer 36, and metal semiconductor alloy contacts 40.

Although the various methods mentioned above describe and illustrate the patterning of both the first and second threshold voltage adjusting material layers in the CMOS devices, the various methods described above can also involve the patterning of a subset of the threshold voltage adjusting material layers used and a combination thereof. That is, the various methods can be used to pattern one of the two threshold voltage adjusting material layers mentioned above, while the other remains as an unpatterned layer within the structure.

Although the various methods mentioned above are described and illustrated for applications in forming planar CMOS devices, the various methods described above can also be integrated into non-planar semiconductor devices such as, for example, finFET devices.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of fabricating a complementary metal oxide semiconductor (CMOS) structure comprising:
   providing a structure including a high k gate dielectric located atop a semiconductor substrate, said semiconductor substrate including at least two device regions;
   forming a first block mask on a surface of the high k gate dielectric in one of the device regions, while leaving the high k gate dielectric exposed in another device region;
   forming a first threshold voltage adjusting material on the first block mask in the one device region and atop the exposed high k gate dielectric in the another device region;
   removing the first threshold voltage adjusting material and the first block mask from the one device region, while maintaining the first threshold voltage adjusting material in the another device region;
   forming a second block mask on the first threshold voltage adjusting material, while leaving the high k gate dielectric within the one device region exposed;
   forming a second threshold voltage adjusting material on the second block mask in the another device region and atop the exposed high k gate dielectric in the one device region; and
   removing the second threshold voltage adjusting material and the second block mask from the another device region, while maintaining the second threshold voltage adjusting material in the one device region.

2. The method of claim 1 wherein said providing the structure includes forming a chemox layer between the high k gate dielectric and the semiconductor substrate.

3. The method of claim 1 wherein said forming the first block mask includes selecting a block mask material selected from a hard mask, a photoresist or a combination thereof.

4. The method of claim 1 wherein said forming the first block mask includes formation of a block mask material, exposure to a desired pattern of radiation and optionally etching.

5. The method of claim 1 wherein said forming the first threshold voltage adjusting material includes selecting from a pFET threshold voltage adjusting material or an nFET threshold voltage adjusting material.

6. The method of claim 5 wherein said first threshold voltage adjusting material is an nFET threshold voltage adjusting material.

7. The method of claim 6 wherein said nFET threshold voltage adjusting material is a rare earth metal-containing material comprising an oxide or nitride of at least one element from Group IIIB of the Periodic Table of Elements or an alkaline earth metal-containing material having the formula $MA_x$ wherein M is an alkaline metal, A is one of O, S and a halide, and x is 1 or 2.

8. The method of claim 5 wherein said first threshold voltage adjusting material is a pFET threshold voltage adjusting material selected from Al, non conductive compounds of Al, Ge, non-conductive compounds of Ge, non-conductive compounds of Ti and non-conductive compounds of Ta.

9. The method of claim 1 wherein said removing the first threshold voltage adjusting material and the first block mask comprises a photoresist stripping process.

10. The method of claim 1 wherein said forming the second block mask includes selecting a block mask material selected from a hard mask, a photoresist or a combination thereof.

11. The method of claim 1 wherein said forming the second block mask includes formation of a block mask material, exposure to a desired pattern of radiation and optionally etching.

12. The method of claim 1 wherein said forming the second threshold voltage adjusting material includes selecting from the other of a pFET threshold voltage adjusting material or an nFET threshold voltage adjusting material not employed as the first threshold voltage adjusting material.

13. The method of claim 1 wherein said removing the second threshold voltage adjusting material and the second block mask comprises a photoresist stripping process.

14. The method of claim 1 further comprising forming a conductive material atop the first and second threshold voltage adjusting materials to form a material stack in each device region.

15. The method of claim 14 further comprising patterning the material stack in each device region to obtain a patterned gate stack in the one device region including, from bottom to top, a patterned high k gate dielectric, a patterned second threshold voltage adjusting material and a patterned conductive material, and a patterned gate stack in the another device region including, from bottom to top, a patterned high k gate dielectric, a patterned first threshold voltage adjusting material and a patterned conductive material.

16. The method of claim 15 wherein each of the patterned gate stacks forms a planar structure or a non-planar structure.

17. The method of claim 1 wherein one of the first threshold voltage adjusting material and the second threshold voltage adjusting material is not removed and as such the steps of block mask formation and removal of one of the first threshold voltage adjusting material and the second threshold voltage adjusting material is omitted.

* * * * *